United States Patent [19]

Rabii

[11] Patent Number: 5,053,729
[45] Date of Patent: Oct. 1, 1991

[54] PULSE-WIDTH MODULATOR

[75] Inventor: Khosro M. Rabii, Arlington Heights, Ill.

[73] Assignee: Zenith Electronics Corporation, Glenview, Ill.

[21] Appl. No.: 636,650

[22] Filed: Dec. 31, 1990

[51] Int. Cl.⁵ .............................................. H03K 7/08
[52] U.S. Cl. ...................................... 332/109; 375/22
[58] Field of Search ............... 332/106, 109; 307/265; 375/22

[56] References Cited

U.S. PATENT DOCUMENTS 4,160,958 7/1979 Mims et al. ...................... 331/4 X
4,685,114 8/1987 Welling .................................. 375/22

Primary Examiner—David Mis

[57] ABSTRACT

A pulse-width modulator accepts a 7 bit binary signal input which is gated to an adder circuit. The adder is also supplied with a constant binary 1 input and has an output that is coupled to an 8 bit delay circuit that has its output coupled back to another input of the adder. The delay circuit and adder act as a recursive filter that is reset when the gate circuit is opened every 128th count. The most significant bit in the output of the delay circuit is a direct measure of the corresponding pulse width of the binary signal and is coupled to an integrating circuit.

10 Claims, 1 Drawing Sheet

PULSE-WIDTH MODULATOR

BACKGROUND OF THE INVENTION AND PRIOR ART

This invention relates generally to pulse-width modulators and particularly to a novel method and apparatus for converting a binary input signal into a pulse-width modulated output signal. The prior art includes many circuits for converting binary signals to pulse-width modulated signals. These circuits typically include a plurality of counters that are not only complex in their operation but expensive to manufacture. The present invention provides a very simple circuit, that can inexpensively be manufactured, to convert an input binary signal to an output signal that is a direct measure of a corresponding pulse-width modulated signal. The output pulse-width modulated signal may be integrated to provide a corresponding analog signal as is well known in the art.

OBJECTS OF THE INVENTION

A principal object of the invention is to provide a novel pulse-width modulator circuit.

Another object of the invention is to provide an inexpensive and simple circuit for converting a binary input signal to a pulse-width modulated output signal.

BRIEF DESCRIPTION OF THE DRAWINGS

These and other objects and advantages of the invention will be apparent upon reading the following description in conjunction with the drawings, in which.

DESCRIPTION OF THE PREFERRED EMBODIMENT

Figure 1:
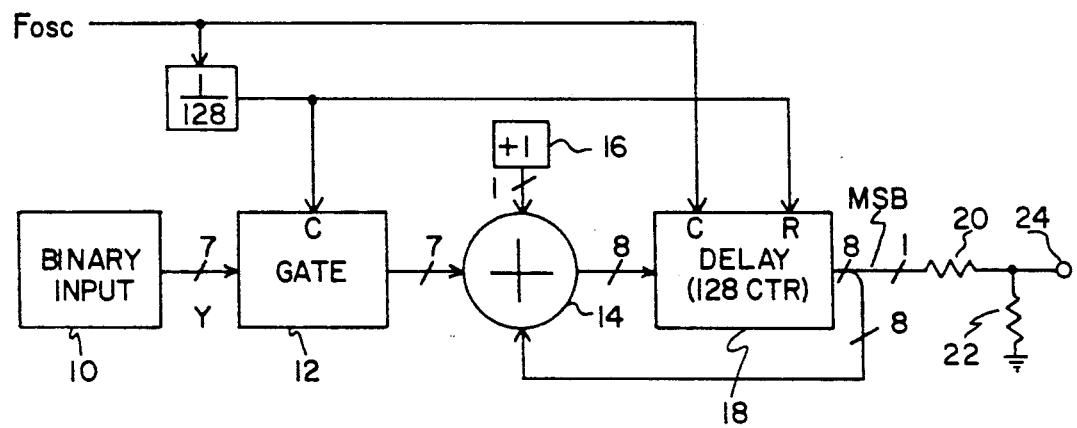
FIG. 1 is a partial block diagram of a pulse-width modulator constructed in accordance with the invention.

Referring to FIG. 1, a binary input signal source 10 is coupled to a gate circuit 12 that, in turn, is supplied to an adder 14. The adder 14 has three inputs and one output, the output being coupled to the input of a delay circuit 18. The output of delay circuit 18 is coupled back to one of the inputs of adder 14. The most significant bit in the output of delay circuit 18 is coupled to an integrating network comprising a resistor 20 and a capacitor 22, the junction of which is coupled to an output terminal 24. The "carry" input of adder 14 is supplied with a constant binary "1" via a circuit arrangement 16. Both the gate 12 and the delay circuit 18 are controlled by a divided-down oscillator signal Fosc. Additionally, the Fosc signal is supplied to the clock input of delay circuit 18 for accumulating or operating the delay circuit.

Those skilled in the art will recognize that the combination of adder 14 and delay circuit 18 in the feedback arrangement shown constitutes a recursive filter. The lines interconnecting the various circuit blocks are marked with numerals which indicate the number of bits. Thus the connection between binary input 10 and gate 12 is indicated by a 7 which indicates a 7 bit bus. Similarly, gate 12 is connected to the input of adder 14 by a 7 bit bus whereas the +1 circuit 16 is coupled by a 1 single lead or a 1 bit bus. The output of adder 14 constitutes an 8 bit bus as does the output of delay circuit 18, whereas the most significant bit (MSB) input to the integrator resistor 20 is a one bit bus.

Figure 2:
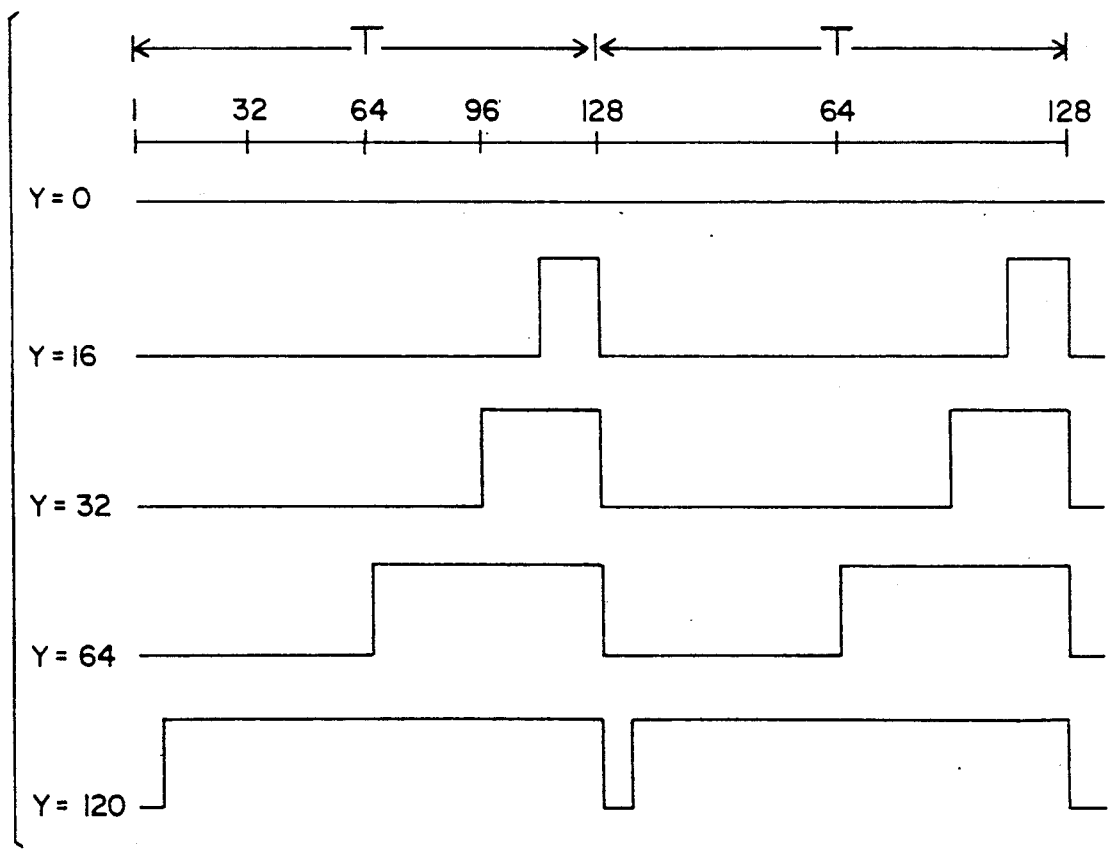
FIG. 2 is a series of waveforms illustrating operation of the circuit of FIG. 1.

In FIG. 2, a series of waveforms is illustrated for various input a binary signal "Y". For example, the output waveforms, that is the integrated waveforms available at output terminal 24 of FIG. 1 for values of y=0, 16, 32, 64 and 120 are illustrated. The waveforms assume a 7 bit binary input signal (corresponding to a 128 maximum count). In the general case, the binary input number of bits x, requires a delay circuit having a bit capacity of (x+1).

In operation, a binary input signal y is applied to gate 12 where, under control of the clock signal Fosc/128, a series of binary 1's on the 7 line input bus to adder 14 indicates the decimal count or value of the binary input signal y (pulse-position modulation). This is incremented by the +1 binary input from circuit 16 and the output of the adder 14 is applied to delay circuit 18. In practice, delay circuit 18 may be a series of flip-flops that are supplied, in parallel, by the 8 bit output bus from adder 14 and which produce a corresponding output.

Assuming that the delay circuit 18 is set to zero, and that the binary input signal y is equal to decimal 16, the initial input to delay circuit 18 will be decimal 17 (16+1). The delay circuit output (17) is coupled back to the input of adder 14 where it is incremented by 1 from circuit 16 and reapplied to the input of the delay circuit 18. It should be noted that the binary input signal supplied by gate 12 is no longer present on the input bus to adder 14 because of the clock signal Fosc/128, which opens or operates the gate. The recursive filter of the arrangement results in a successive incrementation of the signal with the output of delay circuit 18 reflecting the total count (initial count and successive increments). When the capacity of delay circuit 18 is reached, that is when it "overflows," to the most significant bit position, the MSB in its output changes its state from 0 to 1. The corresponding change in voltage level is applied to the integrating network (resistor 20 and capacitor 22) and results in a positive voltage output which is illustrated in FIG. 2.

For x=0, the output voltage remains at zero since, if the binary input signal is decimal zero, the delay circuit 18 never reaches a count of 128 during the 128 count period (it only achieves a count of 127). When y is 16, the input to delay circuit 18 is 17 (16+1) and the delay circuit will overflow at the 112th clock pulse to produce an MSB output for the next 16 clock pulses. Similarly, when y is 32, delay circuit 18 overflows at the 96th clock pulse and its MSB remains at a high logic level voltage until the delay circuit is reset (a period of 32 clock pulses). As can be seen, the duration or width of the output signal at output terminal 24 is a direct function of the value of the binary input signal y (pulse-position modulation). Thus what has been shown is a simple circuit arrangement for converting a binary number into a pulse-width modulated signal.

It is recognized that numerous modifications and changes in the described embodiment of the invention will occur to those skilled in the art without departing from its true spirit and scope. The invention is to be limited only as defined in the claims.

What is claimed is:

1. A method of converting a binary number of x bits into a pulse-width modulated analog signal comprising:
   incrementing said binary number by one bit;

applying the incremented number to a recursive filter having a period of $(2^x+1)$; and recovering the most significant bit in the output of said recursive filter.

2. The method of claim 1, further including applying said binary number to a gate and simultaneously operating said gate and resetting said recursive filter after a period equal to a $(2^x+1)$ bit count.

3. The method of claim 2 wherein said incrementing of said binary number includes applying the output of said gate as an input to an adder that also has a constant binary 1 input.

4. The method of claim 3 wherein said recursive filter is an $(x+1)$ bit delay circuit and said adder, with the output of said delay circuit coupled back to an input of said adder.

5. The method of converting a binary number of x bits into a pulse-width modulated signal comprising:

supplying said binary number to a gate;

supplying the output of said gate to an adder along with a constant binary 1 input;

applying the output of said adder to a delay circuit of $(x+1)$ bit capacity that has its output coupled back to the input of said adder;

operating said gate and resetting said delay circuit after a period equal to a $(2^x+1)$ count; and recovering the most significant bit in the output of said delay circuit.

6. A pulse-width modulator comprising:

means receiving a binary input signal of x bits;

means for successively incrementing said binary input signal by a binary 1;

means for applying said successively incremented binary signal to a delay circuit having a capacity of $(x+1)$ bits; and means for developing a pulse-width modulated signal based upon overflow of said delay circuit.

7. The modulator of claim 6 wherein said successively incrementing means comprises an adder having one input receiving a constant binary 1 input and another input coupled to the output of said delay circuit.

8. The modulator of claim 7 wherein said receiving means includes gate means coupled to said adder; and means for simultaneously opening said gate means and resetting said delay circuit after a period equal to a $(2^x+1)$ count.

9. The modulator of claim 8, further including integrating means coupled to receive the most significant bit in said output of said delay circuit.

10. A pulse-width modulator comprising gate means receiving a binary input signal of x bits and having an output;

an adder having a first input coupled to said output of said gate means, a second input for receiving a constant binary 1 and an output;

a delay circuit having a capacity of $(x+1)$ bits and having an input coupled to said output of said adder and an output coupled to a third input of said adder; and means for simultaneously operating said gate and resetting said delay circuit after a period equal to a decimal count of $(2^x+1)$, whereby the most significant bit in the output of said delay circuit is a measure of the pulse-width of the binary signal.

* * * * *